(12) United States Patent
Satsukawa et al.

(10) Patent No.: US 7,536,619 B2
(45) Date of Patent: May 19, 2009

(54) RAM TESTING APPARATUS AND METHOD

(75) Inventors: Yoshihiko Satsukawa, Kawasaki (JP); Hisashi Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 535 days.

(21) Appl. No.: 11/352,988

(22) Filed: Feb. 14, 2006

(65) Prior Publication Data

US 2006/0236178 A1 Oct. 19, 2006

(30) Foreign Application Priority Data

Mar. 25, 2005 (JP) ............................. 2005-088821

(51) Int. Cl.
*G11C 29/00* (2006.01)
*G01R 31/28* (2006.01)

(52) U.S. Cl. .................... 714/732; 714/734; 714/736

(58) Field of Classification Search ................ 714/719, 714/723, 724, 726, 729, 733, 734, 736
See application file for complete search history.

(56) References Cited

U.S. PATENT DOCUMENTS

| 6,523,135 | B1 | 2/2003 | Nakamura | |
| 6,536,005 | B1 * | 3/2003 | Augarten | 714/723 |
| 6,658,611 | B1 * | 12/2003 | Jun | 714/719 |
| 6,988,232 | B2 * | 1/2006 | Ricchetti et al. | 714/736 |
| 2002/0194558 | A1 * | 12/2002 | Wang et al. | 714/718 |

FOREIGN PATENT DOCUMENTS

| JP | 61217839 | A | * | 9/1986 |
| JP | 09127206 | A | * | 5/1997 |
| JP | 11039226 | | | 12/1999 |
| WO | 01/01422 | A1 | | 4/2001 |

OTHER PUBLICATIONS

"Test response compression and bitmap encoding for embedded memoriesin manufacturing process monitoring" by Chen et al. This paper appears in: Test Conference, 2001. Proceedings. InternationalPublication Date: 2001 On pp. 258-267 ISBN: 0-7803-7169-0 INSPEC Accession No. 7211343.*
NN9511467 "Low-Cost Array Built-In Self-Test Data Comparison for Embedded Arrays" IBM Technical Disclosure Bulletin, Nov. 1995, US vol. No. 38 Issue No. 11 pp. 467-468 Publication-Date: Nov. 1, 1995 (19951101) Cross Reference: 0018-8689-38-11-467.*
European Search Report mailed on Jun. 30, 2006 in corresponding application No. 06250627.4-2210.

* cited by examiner

Primary Examiner—Cynthia Britt
(74) Attorney, Agent, or Firm—Staas & Halsey LLP

(57) ABSTRACT

Since fault detection is not conducted for the address other than the noted address or the expected value other than the noted expected value in the RAM test, generation of a fault can be discriminated easily for the predetermined noted address or noted expected value when a fault is detected. Moreover, since the noted address is set as a single address but as the predetermined address range, when a fault is generated after the test for the relevant address range, the total number of times of test can be controlled by conducting the screening test for the address range where a fault is generated.

16 Claims, 15 Drawing Sheets

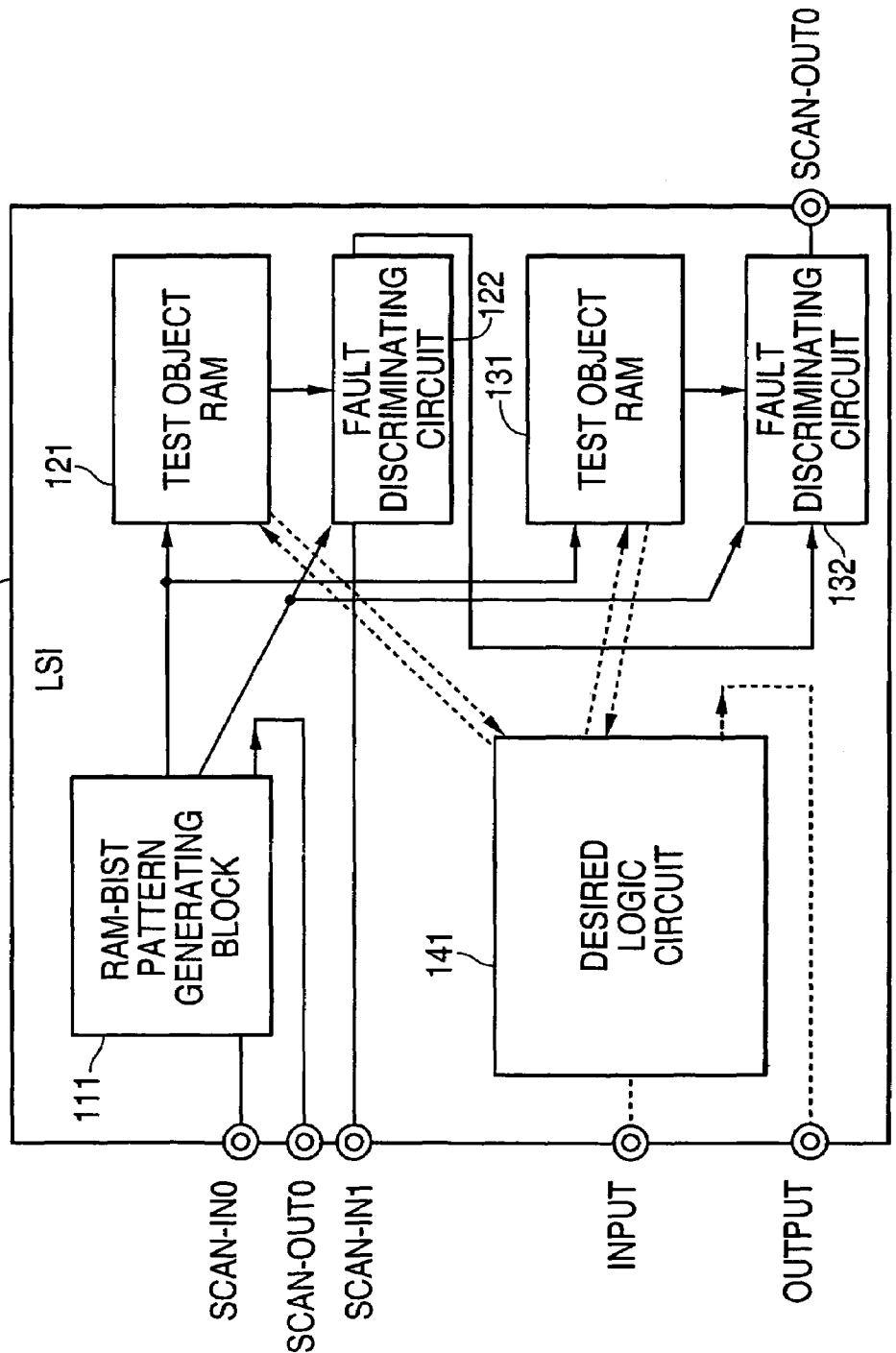

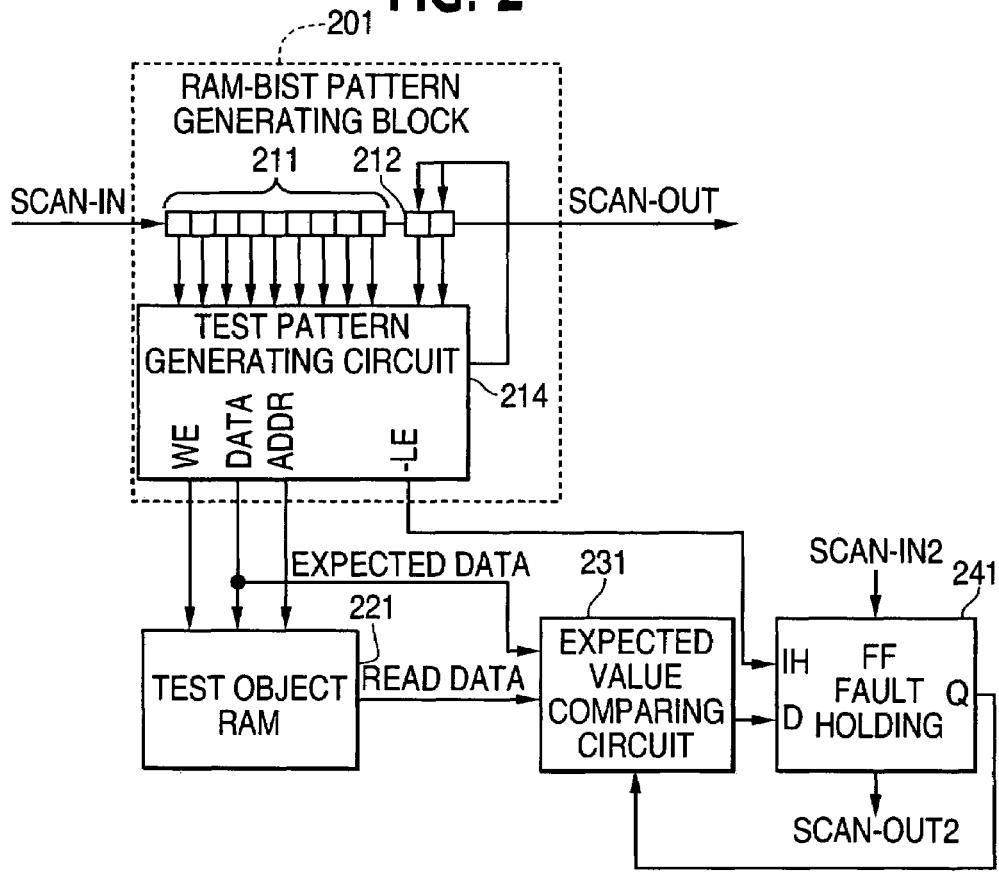
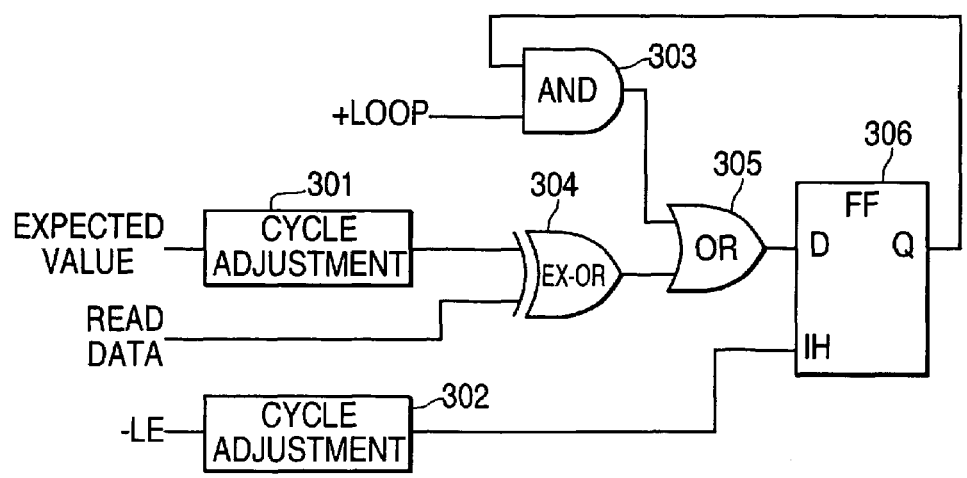

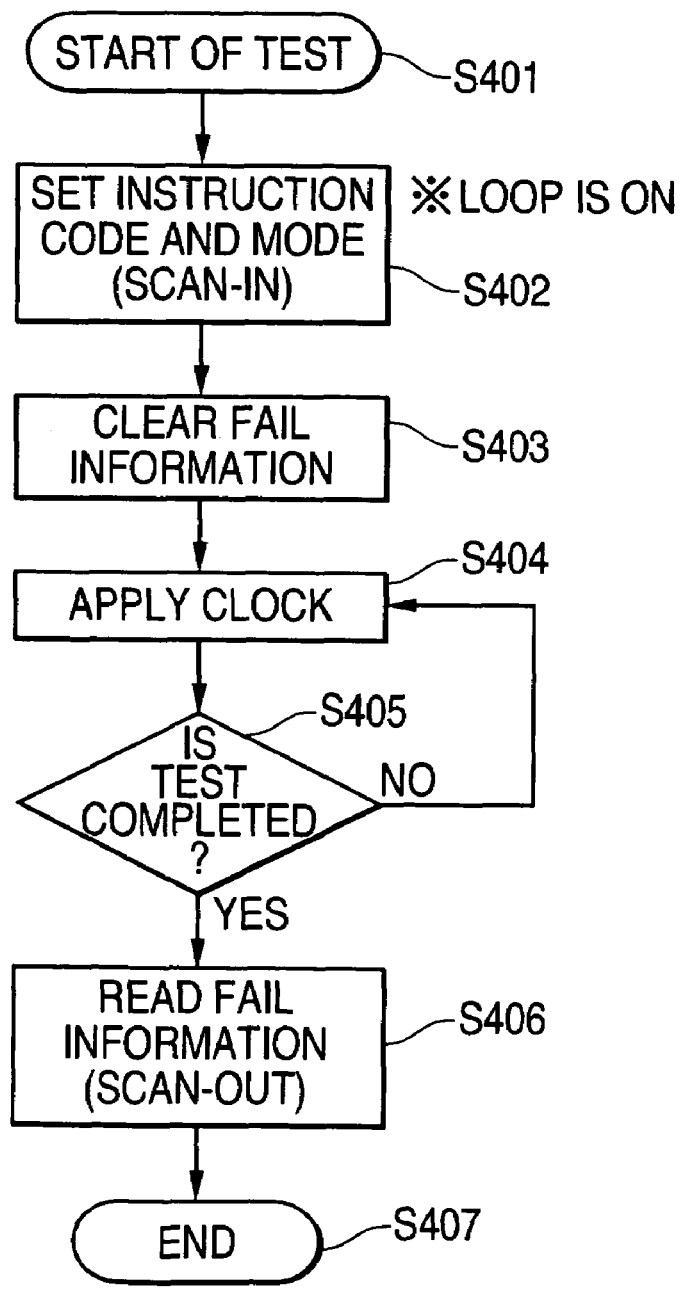

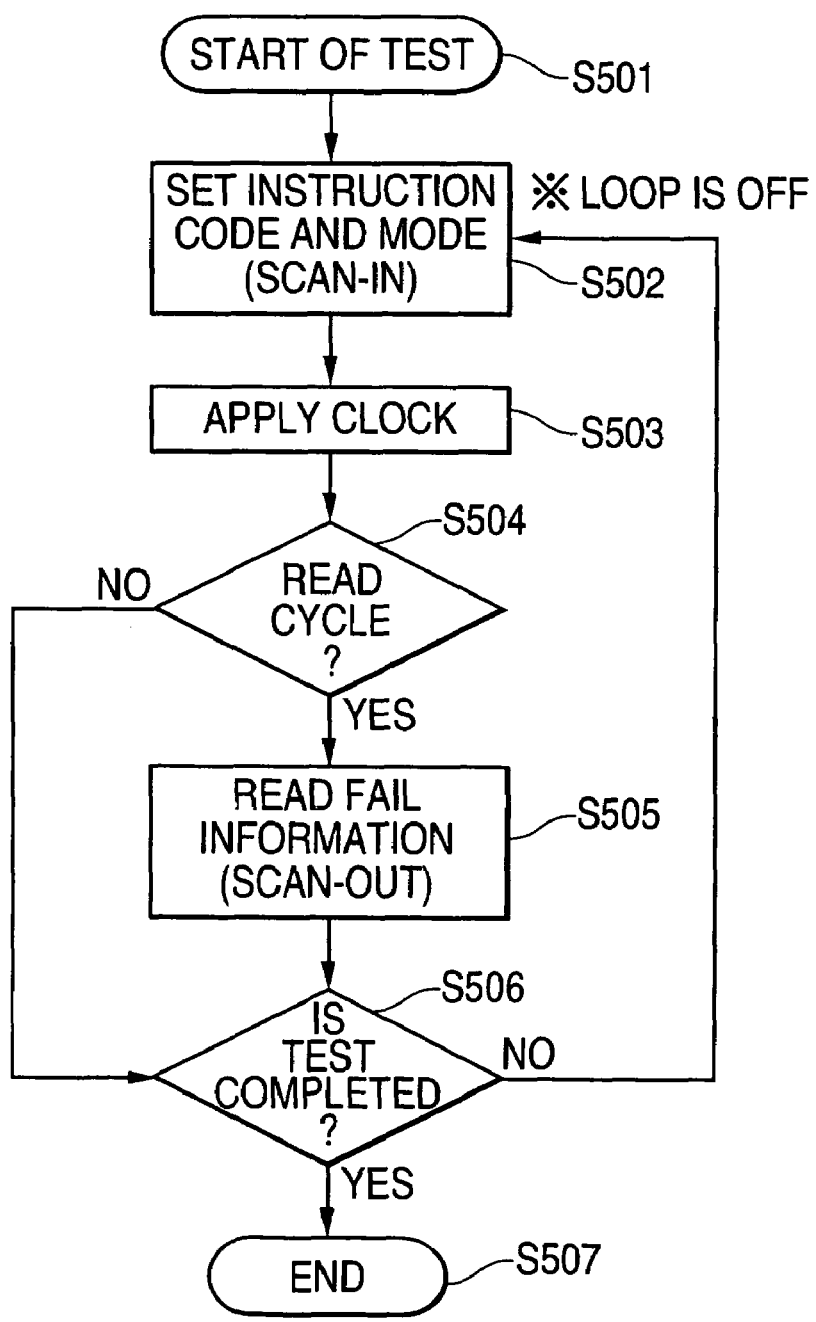

RAM TESTING APPARATUS AND METHOD

CROSS-REFERENCE TO RELATED APPLICATIONS

This application claims priority to JP 2005-08821, filed Mar. 25, 2005, the subject matter of which is incorporated herein in its entirety by reference.

BACKGROUND OF THE INVENTION

1. Field of the Invention

The present invention relates to a testing apparatus and a testing method for RAM (Random Access Memory) within an LSI (Large Scale Integrated) circuit such as a CPU (Central Processing Unit) or a DSP (Digital Signal Processor). In particular the present invention relates to a circuit and a method for acquiring the FBM (Fault Bit Map) information indicating the physical location information (address or bit) of a fault in a fault analysis.

2. Description of the Related Art

In a conventional LSI, such as a CPU or a controller used as the core device of an information processor or a computer system, a primary cache memory may be listed as a RAM comprised in the relevant CPU. A secondary cache memory, such as a large capacity RAM, has been realized with an external SRAM device, such as a CPU, because of limitations on semiconductor technology. Subsequently, with progress of ultra-fine micro-technology in the semiconductor device and improvement of required performance for the CPU, the primary cache memory as well as the secondary cache memory has also been realized. However, as the area in the RAM, which the secondary cache memory gradually occupies, becomes a greater part of the die area of the CPU, reduction in the manufacturing yield due to a failure or a fault caused by dust in the manufacturing processes has become an important problem.

Accordingly, with progress in the ultra-fine micro-technology of the semiconductor device, a new problem has appeared. Namely, the influence on the physical characteristics of the semiconductor of fluctuations in the manufacturing processes has become larger, exceeding the design assumptions, and thereby faults in the semiconductor manufacturing process resulting from insufficient margin in the relevant physical characteristics are being generated more easily than in the past. Moreover, with the relevant problem explained above, the quality of individual RAM will have a large influence on the total quality of LSI and the manufacturing yield thereof.

Accordingly, it is required to improve the circuits in the RAM by conducting fault analysis. Such a fault analysis could be conducted by acquiring the detail information of the relevant fault while a fault caused by insufficient margin in the physical characteristic of the RAM is reproduced.

FIG. 1 illustrates a schematic diagram of an ordinary LSI. Within the LSI 101, an arithmetic logic circuit 141 realizes the inherent function of the relevant LSI and RAMs 121, 131 for holding the data used by the relevant arithmetic logic circuit 141. The arithmetic logic circuit 141 also includes terminals (IN, OUT) for interfacing with external circuits of the LSI. Moreover, the read and write operations of data are conducted between the relevant arithmetic logic circuit 141 and RAMs 121, 131. The RAM includes many elements, such as transistors, in high density among the circuits included in the LSI. Therefore, testing of such a RAM is very difficult.

Therefore, in recent years, many improvements have been made to ensure easier testing of the RAM. One such improvement is by mounting a RAM-BIST (Built-In Self Test) circuit as the self-diagnosis mechanism for RAM into the LSI. The relevant RAM-BIST circuit is formed of a RAM-BIST pattern generating block 111 and fault discriminating circuits 122, 132. In FIG. 1, the RAM-BIST pattern generating block 111 and fault discriminating circuits 122, 132 are objects to which the circuit of the present invention is mounted, while the RAMs 121, 131 are objects in which ease of fault analysis can be improved with the present invention.

FIG. 2 illustrates an example of a structure of a RAM-BIST circuit of the background art. The RAM-BIST circuit in this embodiment is formed of a RAM-BIST pattern-generating block 201. The RAM-BIST circuit also includes a test pattern generating circuit 214 as a peripheral circuit of the test object RAM 221, an expected value comparing circuit 231 forming a fault detecting circuit, and a fault holding FF (flip-flop) 241.

The test pattern generating circuit 214 built in the RAM-BIST pattern generating block 201 sets the instruction code or mode signal to be given to the test pattern generating circuit 214 with a scan FF (flip-flop) group 211 connected to a scan chain, which is input from the scan-in and output to the scan-out. The test pattern generating circuit 214 also sets the initial value of a counter within the test pattern generating circuit 214 with a scan FF group 212 within the test pattern generating circuit 214. The RAM-BIST pattern-generating block 201 generates the programmable signal to a test object RAM 221 and provides the signal to an expected value comparing circuit 231 and a fault holding FF 241 forming a fault discriminating circuit.

The write enable (WE) signal for discriminating the write and read operations, the writing data, and a read or write object address (Addr) are distributed to the test object RAM 221. An expected value data for comparison with the read data from the test object RAM 231, and a negative logic load enable (−LE) signal for determining discrimination or non-discrimination of a fault, are distributed to an expected value comparing circuit 231 which forms the fault discriminating circuit. During the write operation, the relevant expected value data is the "don't care" value, while during the read operation, the write data is the "don't care" value. Therefore, the expected value data signal and the data signal may be used during the write operation in common through the control with the write enable (WE) signal.

The fault holding FF 241 forming the fault discriminating circuit includes a circuit for comparing the read data of the test object RAM 221 with the expected value data. The fault holding FF 241 also includes an FF for recording the relevant comparison result (fault information). In general, one of these circuits is provided for each bit of the RAM output. The expected value data to be read from the output of the test object RAM, and the negative logic load enable (−LE) signal for determining fault discrimination, are received from the RAM-BIST pattern-generating block 201. The fault discrimination should not be conducted during the write operation of the relevant test object RAM because the relevant RAM output is the "don't care" value or a fixed value. Accordingly, during the write operation of the relevant test object RAM, the negative logic load enable (−LE) signal, which is prevented from executing the fault discrimination, is generated by the test pattern generating circuit 214.

Moreover, in the test for mass-production, the RAM-BIST pattern-generating block generates the test pattern signal for each clock cycle and executes the fault discrimination many times while the address of RAM is changed in the single test. If a fault is detected even once among a plurality of fault discriminations, the fault is discriminated in the relevant test object bits. Therefore, a record of faults detected in the past can be held even when a feedback loop circuit exists in the fault discriminating circuit and a fault is not detected during the new fault discriminating period. Moreover, if a further fault is detected after faults have been detected in the past, a record of the fault is over-written by the relevant feedback loop circuit. The fault holding FF forming the fault discriminating circuit is connected to the scan-chain other than the scan-chain of the RAM-BIST pattern-generating block. Accordingly, the fault holding FF can be initialized by clearing the fault information at the time of initial setting before start of the test and the relevant test result can be read from a scan-out 2.

FIG. 3 illustrates an example of a fault discriminating circuit structure for one bit in the background art. The expected value comparing circuit is formed of an Ex-OR (exclusive OR) gate 304. When the read data from the test object RAM is matched with the expected value data, the expected value comparing circuit outputs '0' because the test result is judged good. When the read data is mismatched, the expected value comparing circuit outputs '1' because the test result is judged bad (fault). The relevant test result is written into the FF 306 passing through the OR (logical sum) gate 305.

Moreover, when the feedback loop circuit is used for test (loop='1') and a fault has already been detected in the same bit, the state having detected the relevant fault is held in the FF 306 with the relevant feedback loop formed of the AND (logical product) gate 303. Accordingly, even after the fault discrimination has been repeated a number of times, the FF 306 can be used as a flag indicating whether a fault is generated in the relevant bit or not. Comparison of the expected value should not be conducted during the write operation to the test object RAM because the read data from the relevant test object RAM does not have any meaning. Therefore, the negative load enable (−LE) signal is set to (−LE='1') while the RAM-BIST pattern generating block and updating of the value held by the FF 306 is inhibited with the IH (inhibit) terminal of the FF 306. In general, since one or more cycles are required to read the read data from the RAM, the expected value and negative logic load enable signal are adjusted in the cycle with the cycle adjusting circuits 301, 302 formed of the shift register in order to adjust the cycle of the read data.

FIG. 4 illustrates an example of test flow in which the RAM-BIST circuit of the background art is used. This is an example of a test flow used for fault discrimination of the relevant LSI, or for determining the relief object bits of the fault, using a redundant circuit of RAM in the mass production test of LSI.

First, after start of test (step S401), the instruction code and mode signal are set by scan-in for the scan chain of the RAM-BIST pattern-generating block. The initial value of the counter within the RAM-BIST pattern generating block is also set (step S402). In this case, the feedback loop circuit in the fault discriminating circuit is set to ON (loop='1'), and initialization is conducted by clearing the fault information held in the fault holding FF in the fault discriminating circuit (step S403).

As the next step, as many clocks as required for the relevant RAM test are applied to the test object RAM (step S404 to S405). The write and read operations of the test object RAM are executed with the test pattern automatically generated in the RAM-BIST pattern generating block each time a clock is applied. Fault discrimination in the fault discriminating circuit is also conducted. After application of the clocks required for the test object RAM, the fault holding FF in the fault discriminating circuit holds the fault information for each bit. The relevant fault information is read (step S406) to the external side of the test object LSI using the scan chain. Thereafter, the test using the RAM-BIST circuit is completed (step S407). Since the relevant fault information corresponds to each bit of the test object RAM, a fault-generating bit can be discriminated from the bit location in the relevant scan chain. However, it is still impossible to discriminate a fault generating address of the test object RAM.

In a fault analysis of an LSI, it is required to identify the physical location where a fault is generated. Moreover, when the relevant fault is generated, it is required to discriminate whether a high value was read when a low value is expected, or, on the contrary, whether a low value was read when a high value was expected. As a method of fault analysis of LSI, it is also required to estimate a cause of fault of the test object RAM from the information. Such an estimate may include a distribution of the physical locations of the detected faults and a profile of fault generation. Such information is called the FBM (Fault Bit Map) information.

FIG. 5 illustrates an example of the test flow when the FBM information is obtained in the RAM-BIST circuit of the background art. The RAM-BIST circuit in the background art is not provided with a means for identifying the fault generating address. Therefore, the fault information being held in the fault holding FF of the fault discriminating circuit is read with the scan chain whenever the data is read from the test object RAM, whether or not a fault is generated in this timing. A pattern location where a fault is detected can be identified by scan shift of the fault information after each read operation of the test object RAM. The fault generating address and the expected value data obtained with the read operation can be analyzed with the relevant scan-shifted information. Each step of the relevant test flow will be explained below.

First, the instruction code and mode signal are set by conducting scan-in for the scan chain of the RAM-BIST pattern generating block after start of test (step S501). The initial value of the counter in the RAM-BIST pattern-generating block is also set (step S502). In this case, the feedback loop circuit in the fault discriminating circuit is set to OFF (loop='0'), and initialization is executed by clearing the fault information held by the fault holding FF within the fault discriminating circuit (step S502).

As the next step, clocks are applied to the test object RAM (steps S503). The write and read operations of the test object RAM are executed with the test pattern automatically generated in the RAM-BIST pattern generating block whenever the clock is applied. Fault discrimination of the relevant test object RAM is conducted with the fault discriminating circuit. After each read operation (step S504) of the test object RAM, the fault information held in the fault holding FF in the fault discriminating circuit is read to the external side of the test object LSI using the scan chain (step S505). With repetition of the process explained above (steps S504 to S505), the test using the RAM-BIST circuit is completed (step S507).

In this example, fault information, such as the content held in the fault holding FF in the fault discriminating circuit, is scan shifted, but the content held in the FF for setting, such as instruction code and mode signal in the pattern generating circuit, is not scan shifted, in order to hold the setting state for continuation of operations with application of the next clock. The read operation by application of the relevant clock and scan shift of the fault information is repeated until the test is completed. In this test flow, a fault generating bit and a fault generating read cycle can be analyzed easily.

High speed operation test of the test object RAM is possible in the test flow of FIG. 4, since a test process is completed only with application of clock after the initial setting. However, since the bit information amount of one bit is provided in the address direction for each bit of the output of test object RAM, a problem arises in that the information of the fault generating address cannot be obtained and thereby the FBM information cannot be attained.

Moreover, the FBM information can be acquired in the test flow of FIG. 5, but the read operation by scan shift of the fault holding FF in the fault discriminating circuit is generated for each read operation of the test object RAM. Therefore, as a single clock is applied during operation of the test object RAM, a fault of the type to be generated by high-speed continuous application of the clock to the RAM cannot be reproduced in some cases.

Therefore, the test method using the RAM-BIST circuit of the background art cannot be said to have higher fault analysis capability, because it is impossible to simultaneously realize operation speed similar to the actual operating condition of the test object LSI and acquire test and FBM information based on the operation pattern.

FIG. 14 illustrates an example of structure of an ordinary RAM cell circuit of one bit. FIG. 14 illustrates the RAM cell circuit of one bit formed of pMOS transistors (positive Metal Oxide Silicon) 1401, 1402, nMOS transistors (negative Metal Oxide Silicon) 1403, 1404, and INV (inverter) gates 1405, 1406.

Next, the write operation in the relevant RAM cell circuit will be explained. First, the bit lines BL1409, XBL1410 are precharged in the initial state. Next, when the address, write data, and write enable signal (not illustrated) reach the RAM input terminal, and the clock pulse is also applied, the RAM starts operation and the BL1409 and XBL1410 are driven in accordance with the write data. Next, when the row address (not illustrated) is decoded, the INV (inverter) gates 1405, 1406 forming a recording element become conductive, and the data is held in the relevant storage element as the storage state Q by generating the pulse to the decoded word line WL1408. Moreover, the precharge operation is started with a PC14070 and thereby the bit lines BL1409 and XBL1410 are driven to the high state.

The read operation of the relevant RAM cell circuit will now be explained. First, the bit lines BL1409, XBL1410 are precharged in the initial state. Next, when the address, write data, and write enable signal (not illustrated) reach the RAM input terminal and the clock pulse is applied, the RAM starts operation. Next, when the row address (not illustrated) is decoded, the INV (inverter) gates 1405, 1406, which form a recording element, become conductive by generating the pulse in the decoded word line WL1408. With content of the storage state Q of the relevant storage element, potential of the bit lines BL1409 or XBL1410 is lowered and a potential difference is generated between the bit lines BL1409 and XBL1410. Here a sense amplifier (not illustrated) starts operation and a read value is determined by a potential difference between the bit lines BL1409 and XBL1410. Moreover, the PC1407 starts the precharge operation to drive the bit lines BL1409, XBL1410 to the high state.

FIG. 15 illustrates a timing chart showing an example of a fault of the type generated by high-speed application of a continuous clock to the RAM, namely an example of a fault generated in the high-speed operation test of RAM.

For example, a fault may be generated because the operation of the next cycle is started before completion of the precharge of the bit line. In particular, if the read operation starts potential fall 1502 before sufficient completion of potential rise by the precharge 1501, a potential difference between the bit lines BL and XBL may not be sufficient, and erroneous data may be output. Otherwise, the time (delay time) required to establish an output in the read operation is increased, adversely effecting the performance.

Moreover, when a delay time becomes longer because a sufficient potential difference between the bit lines BL and XBL cannot be acquired, a word line pulse 1504 is sometimes generated before completion 1503 of the decoding of the address. When the output delay becomes large in such a read operation, an increment of the relevant delay can be detected with an earlier application of the clock after the read operation.

Moreover, a precharge sometimes produces an adverse effect on the storage element. When the assert period overlaps with the precharge period of the word line, an adverse effect may be produced in the holding capability of the storage element. This adverse affect may be due to the before and after relationship of the timings of the generation of word line pulse 1504 by the decoding and the precharge 1505, because both bit lines BL and XBL of the storage element are driven to the high value. Even when the relevant adverse effect is within the range of margin of the RAM characteristic, however, the data cannot be held normally in some cases if such adverse effect is generated repetitively at a high rate for the RAM cell exhibiting the bad characteristic. Moreover, if an interval of the relevant word line pulse 1504 is sufficiently long, there arises a problem in that there is a higher possibility that a fault cannot be detected, because the potential is recovered with the loop circuit of the inverter which forms a storage element.

FIG. 16 illustrates a timing chart for a read operation of the next cycle, which is started before sufficient precharge of the bit lines during the write operation in the high-speed operation test of RAM.

Access may also be made to the other addresses during the write and read operations, and the data values of the relevant write object and read object will be in an inverted relationship with each other. If the next read operation starts before completion of precharge, sufficient potential difference is not generated in some cases between the bit lines BL and XBL. This may be because the precharge start timing is delayed, or the precharge driving capability is low, or when the sense amplifier operation starts due to a complicated reason such as drive capability of RAM cell is low. In this case, an error is generated in the read data, but a sufficient precharge is generated when the read cycle is longer. Accordingly, there arises a problem that the fault cannot be reproduced.

The JP-A No. 1999-39226 discloses in a test object RAM and a self-test circuit for testing the test object RAM. The self-test circuit comprises a controller for outputting a control signal when it receives the test clock and the test start signal. An address generator generates an address signal when it receives the control signal and outputting such address signal to the RAM.

A data generator generates a test data when it receives the control signal and outputs the test data to the RAM. A comparator compares the given test data output by the data generator to the actual data read after the RAM and writes the given test data and outputs an error signal when the test data is different from the actual data. A scan circuit receives the actual data output from the storage device or the address signal output from the address generator and provides a serial output.

A multiplexer selectively outputs, on the basis of the control signal, any error signal output from the comparator, an error signal output from the scan circuit, or an actual data output from the scan circuit or the address signal When the error signal is output after start of the test, the actual data when the error was generated is output to the external side via the multiplexer, and moreover the address signal corresponding to such actual data is output to the external side via the multiplexer.

Namely, this technology discloses that when an error is generated in the RAM test, the actual data or address related to the error generated is held and the relevant information is read to the external side of the LSI with the scan shift.

However, the technology disclosed by the JP-A No. 1999-39226 has a problem in that since the test operation of RAM is stopped when a fault in the test object RAM is detected, a fault of the type generated when the clocks are continuously applied in a higher rate to the relevant RAM cannot be reproduced.

SUMMARY OF THE INVENTION

On the other hand, the present invention differs from JP-A No. 1999-39226 in that when a fault is generated the operating condition is not detected later by reading such operating condition to the external side of LSI with the scan shift, but rather the test is conducted by previously limiting the condition of fault detection. Therefore the operating condition is already detected as a precondition when the fault is generated and it is no longer required to detect the operating condition later.

Moreover, in the technology disclosed in the JP-A No. 1999-39226, the test operation is interrupted because the scan shift is required, if an error is generated, for the operating condition when such error is generated, while in the case of the present invention the test operation is not interrupted.

Accordingly, the scope of technical field disclosed in the JP-A No. 1999-39226 can be said to be within the scope of the background art because JP-A No. 1999-39226 does not disclose the effective RAM test apparatus and method in regard to the RAM test apparatus and method using the RAM-BIST.

If the fault information of a fault is scan-shifted for the read operation when the clock is continuously applied after the initial setting of the RAM-BIST pattern generating block, and the fault is detected after completion of application of the clock in the RAM-BIST circuit for testing the RAM comprised in the LSI such as a CPU and controller, the information of the fault generating address cannot be obtained and furthermore, the FBM information also cannot be obtained because only one bit is provided in the address direction.

Moreover, if the fault information is scan-shifted in every application of the clock for the read operation after the initial setting of the RAM-BIST pattern generating block in the RAM-BIST circuit for testing the RAM comprised in the LSI such as a CPU and controller, the fault of the type generated by continuous application of the clock in the higher rate to the RAM cannot be reproduced because the clock is applied one by one during the operation.

In one aspect, an apparatus and a method for testing RAM is provided in which generation of a fault in the read operation for the noted address can be discriminated when the fault information is held in the fault holding FF of the fault detecting circuit, after completion of RAM test, by detecting the fault only during the read operation for the particular noted address in the RAM-BIST circuit for testing RAM comprised in the LSI such as a CPU and controller.

In another aspect, an apparatus and a method for testing RAM is provided in which the fault detection of a read operation is executed only for the particular expected value data and, when the fault is detected, for example, in the test setting the fault detection only for the low expected value, the fault can be discriminated because the read data, which should be the low expected value, is a high value. Moreover, an apparatus and a method for testing RAM is provided in which, when a fault is detected in the test setting the fault detection only for the high expected value, the fault can be discriminated because the read data, which should be the high expected value, is a low value.

The above aspects can be attained by a semiconductor device including a scan chain and at least a storage device including an address holding circuit which is set with the scan chain, a test pattern generating means for generating a test pattern and inputting the test pattern together with a write address to the storage device, an expected value comparator for comparing a read data output from the storage device with the expected value data output from the test pattern generator by giving a read address from the test pattern generator, a fault holding circuit for holding the result of the comparison as a fault state if error is detected by comparison in the expected value comparator, an address comparator for comparing the noted address held in the address holding circuit with the read address, and a fault-hold controlling means for conducting enable control to the fault holding circuit when an address match between the noted address and the read address has been detected by comparison in the address comparator.

In another aspect, a semiconductor device is provided in which the expected value comparator conducts an enable control of the fault holding circuit when the expected value data output from the test pattern generator is a high value and the read data is a low value during the test if the high value is the expected value. The expected value comparator also conducts an enable control of the fault holding circuit when the expected value data output from the test pattern generator is a low value and the read data is a high value during the test if the low value is the expected value.

In another aspect, a semiconductor device is provided in which the address comparator conducts an enable control of the fault holding circuit when the read address is included within the noted address range, after the masking with a mask means, by providing a comparator for each bit forming an address, and then providing the mask means for masking the output of the comparator.

In another aspect, a semiconductor device is provided which includes an address holding circuit which is set with the scan chain, a test pattern generator for generating a test pattern and inputting the test pattern together with a write address to the storage device, an expected value comparator for comparing a read data output from the storage device with an expected value data output from the test pattern generator by giving a read address from the test pattern generator, a fault holding circuit for holding the comparison result as a fault state when error is detected with comparison in the expected value comparator, an increment means, a noted address storing/resetting flag means which is set with the scan chain, and a noted address storing means for holding a value after increment, with said increment means, of the noted address held in the address holding circuit, wherein the value held in the noted address storing means is reset to the noted address holding circuit by setting the noted address storing/resetting flag means.

In another aspect, a semiconductor device in is provided in which the noted address holding circuit is not connected with the scan chain.

In another aspect, an information processor having a semiconductor device including a scan chain and at least a storage device is provided in which the semiconductor device includes an address holding circuit set with the scan chain, a test pattern generator for generating a test pattern and inputting the test pattern together with a write address to the storage device, an expected value comparator for comparing a read value output from the storage device with the expected value data output from the test pattern generator by giving a read address from the test pattern generator, a fault holding circuit for holding the comparison result as a fault state when error is detected by comparison in the expected value comparator, an address comparator for comparing the expected address held in the address holding circuit with said read address, and a fault-hold controlling means for conducting enable control to the fault holding circuit when address match between the noted address and the read address is detected by comparison in the address comparator.

In another aspect, an information process having a semiconductor device including a scan chain and at least a storage device is provided in which the semiconductor device includes an address holding circuit which is set with the scan chain, a test pattern generator for generating a test pattern and inputting the test pattern together with a write address to the storage device, an expected value comparator for comparing a read data output from the storage device with the expected value data output from the test pattern generator by giving a read address from the test pattern generator, a fault holding circuit for holding the comparison result as a fault state when error is detected by comparison in the expected value comparator, an increment means, a noted address storing/resetting flag means which is set with the scan chain, and a noted address storing means for holding the value after the increment, with the increment means, of the noted address held in the address holding circuit, wherein the value held in the noted address storing means is reset to the noted address holding circuit by setting the noted address storage/resetting flag means.

In another aspect, a method for testing a semiconductor device including a scan chain and at least a storage device is provided in which the semiconductor device includes an address holding circuit which is set with the scan chain, a test pattern generator generates a test pattern and writes the test pattern together with a write address to the storage device, an expected value comparator compares a read data output from the storage device with the expected value data read from the test pattern generator by giving a read address from the test pattern generator, and a fault holding circuit holds the comparison result as a fault state when error is detected by comparison result in the expected value comparator, wherein the fault holding circuit includes a feedback circuit which can be turned ON or OFF in order to set ON the feedback circuit at the time of initialization in the testing of the storage device, execute write and read operations of the test pattern generated with the test pattern generator to and from the storage device in addition to application of the clock thereto, and read the fault information held in the fault holding circuit after completion of write and read operations for all addresses of the storage device.

In another aspect, a method for testing a semiconductor device including a scan chain and at least a storage device is provided in which an address holding circuit is set with the scan chain, a test pattern generator generates a test pattern and writes the test pattern together with a write address to the storage device, an expected value comparator compares a read data output from the storage device with the expected value data read from the test pattern generator by giving a read address from the test pattern generator, and a fault holding circuit holds the comparison result as a fault state when error is detected by the comparison result in the expected value comparator, wherein the fault holding circuit includes a feedback circuit which can be turned ON or OFF in order to set OFF the feedback circuit at the time of initialization in the testing of the storage device, execute write and read operations of the test pattern generated with the test pattern generator to and from the storage device in addition to application of the clock thereto, and also execute the read operation of the fault information held in the fault holding circuit.

In another aspect, a method for testing a semiconductor device including a scan chain and at least a storage device is provided including an address holding circuit which is set with the scan chain, a test pattern generator generates a test pattern and writes the test pattern together with a write address to the storage device, an expected value comparator compares a read data output from the storage device and the expected value data read from the test pattern generator by giving a read address from the test pattern generator, and a fault holding circuit holds the comparison result as a fault state when error is detected by comparison result in the expected value comparator, wherein the fault holding circuit includes a feedback circuit which can be turned ON and OFF in order to set ON the feedback circuit at the time of initialization in the testing of the storage device, execute the write and read operations to and from the storage device of the test pattern generated with the test pattern generator in addition to application of the clock thereto, set OFF the feedback circuit at the time of initialization in the testing of the storage device, after completion of the write and read operations for all addresses of the storage device, and execute the write and read operations to and from the storage device of the test pattern generated with the test pattern generator in addition to application of the clock thereto and also execute the read operation of the fault information held in the fault holding circuit.

These together with other aspects and advantages which will be subsequently apparent, reside in the details of construction and operation as more fully hereinafter described and claimed, reference being had to the accompanying drawings forming part hereof, wherein like numerals refer to like parts throughout.

BRIEF DESCRIPTION OF THE DRAWINGS

FIG. 1 shows a schematic of an ordinary LSI circuit;

FIG. 2 shows a schematic of a RAM-BIST circuit of the background art;

FIG. 3 shows a schematic of a fault discriminating circuit for one bit of the background art;

FIG. 4 shows a flow chart of a test using a RAM-BIST circuit of the background art;

FIG. 5 shows a flow chart of FBM information being acquired in a RAM-BIST circuit of the background art;

DETAILED DESCRIPTION OF THE PREFERRED EMBODIMENTS

First Embodiment

Figure 6:
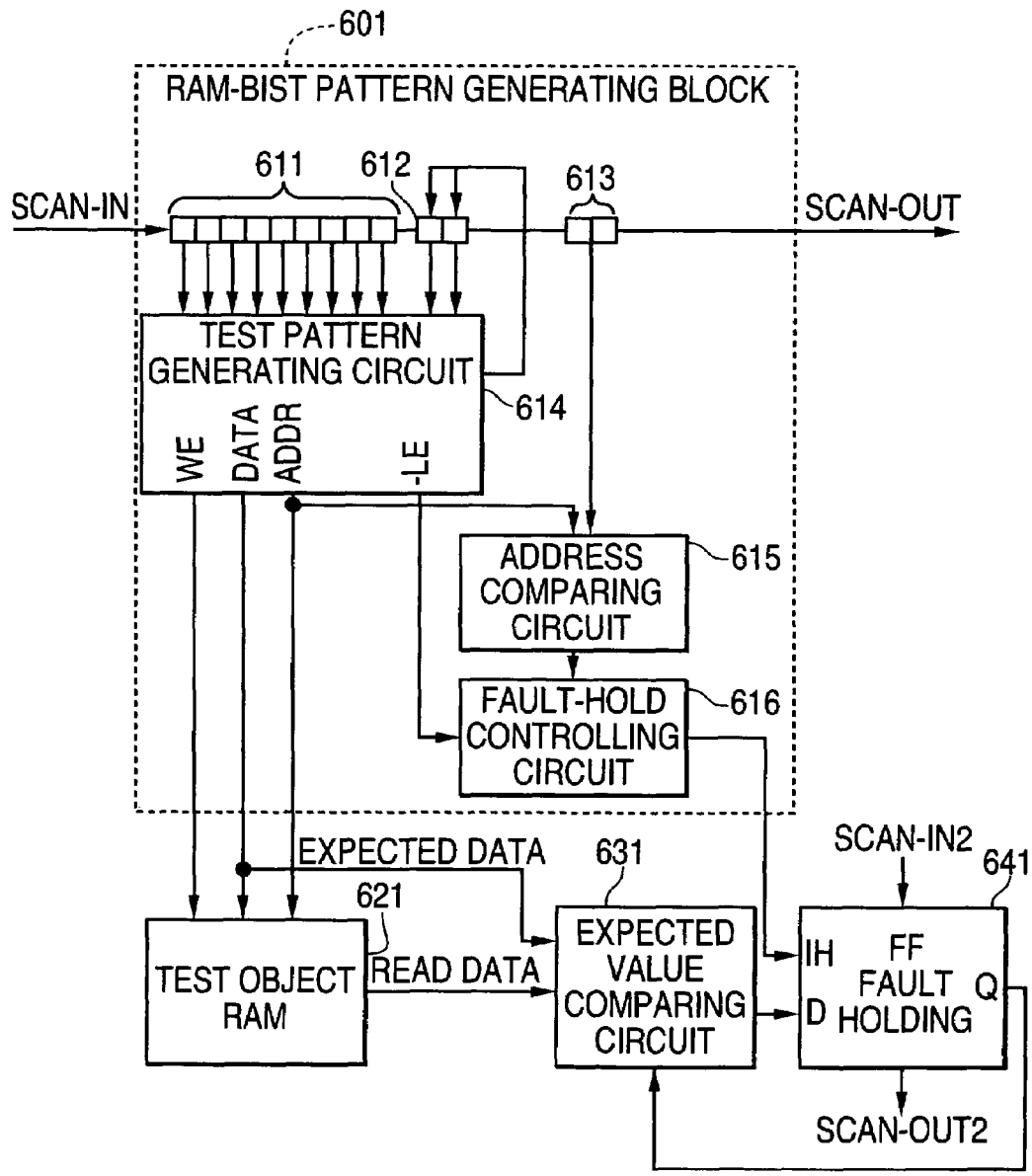
FIG. 6 shows a schematic of a RAM-BIST circuit according to a first embodiment of the invention.

FIG. 6 illustrates an example of structure of the RAM-BIST circuit for fault discrimination of only a single noted address as the first embodiment of the present invention. The RAM-BIST circuit of this embodiment is formed, as the peripheral circuits of the test object RAM 621, of a RAM-BIST pattern generating block 601 including therein a test pattern generating circuit 614, an address comparing circuit 615 and a fault-hold controlling circuit 616, and an expected value comparing circuit 631 and a fault holding FF (flip-flop) 641 forming a fault detecting circuit.

In the test pattern generating circuit 614 comprised in the RAM-BIST pattern generating block 601, the scan FF group 611 connected to the scan chain for input from the scan-in and for output to scan-out sets the instruction code and mode signal to be given to the test pattern generating circuit 614 and the scan FF group 612 for counter setting sets the initial value of the counter within the test pattern generating circuit 614.

Moreover, in this embodiment, a scan FF group 613 for setting noted address to hold the noted address within the scan chain is additionally provided and the address comparing circuit 615 compares the noted address being set to the scan FF group 613 for setting noted address with the scan shift with the read address generated by the test pattern generating circuit 614. If an error is detected by the relevant comparison, the fault-hold controlling circuit 616 executes the control (inhibit control) to provide an enable limitation to the IN (inhibit) terminal of the fault holding FF 641 to prevent the write operation of the relevant fault discrimination result. When the relevant noted address is matched with the read address, the existing negative logic load enable (–LE) signal is output directly. During the write operation of the relevant test object RAM, fault discrimination should not be carried out because the relevant RAM output is the don't care value or the fixed value. Accordingly, during the write operation of the relevant test object RAM, the negative logic load enable (–LE) signal which is controlled to prevent fault discrimination is generated by the test pattern generating circuit 614.

Figure 7:
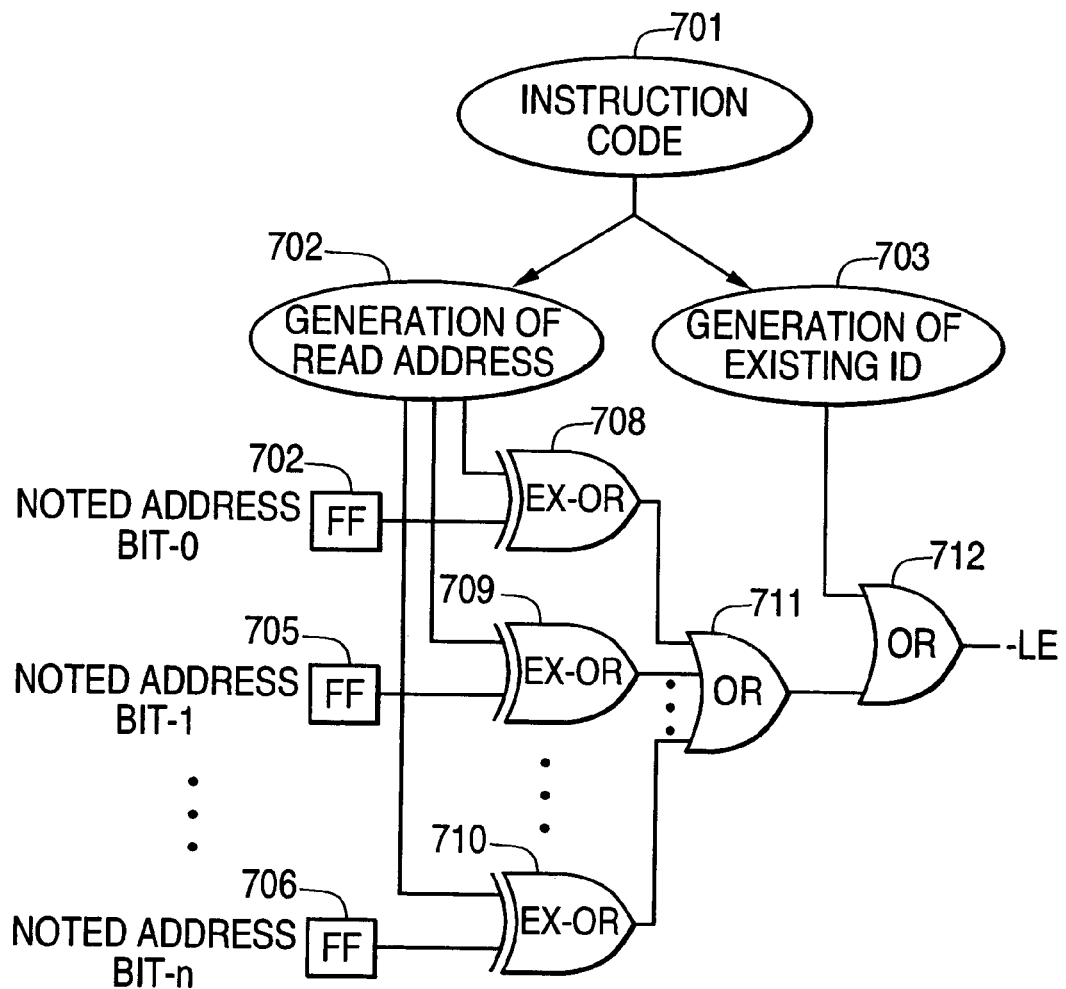
FIG. 7 shows a schematic of an address comparing circuit and a fault holding/controlling circuit for user with the first embodiment of the invention.

FIG. 7 illustrates an example of structure of the address comparing circuit and the fault-hold controlling circuit according to the first embodiment of the present invention. The corresponding bits of the read address 702 generated with setting of the noted address and instruction code 701 being held in the noted address holding FFs 704, 705, . . . , 706 are compared using the 2-input Ex-OR (exclusive OR) gates 708, 709, . . . , 710. The 2-input Ex-OR gate outputs '1' for mismatch of input. If mismatch is detected even in one bit among the bits forming the corresponding address with the OR gate to which the output of each Ex-OR gate is connected, the load enable (–LE) signal outputs '1'. As a result, content held in the fault holding FF is maintained by inhibiting update of the fault holding FF. When all bits forming the address are matched, all 2-input Ex-OR gates output '0'. Accordingly, the existing load enable generating logic 703 generated by setting of the instruction code 701 is output as the load enable (–LE) signal. Therefore, it is possible to conduct the control to execute the fault discrimination only when fault discrimination is required in the RAM test as explained above.

Second Embodiment

Figure 8:
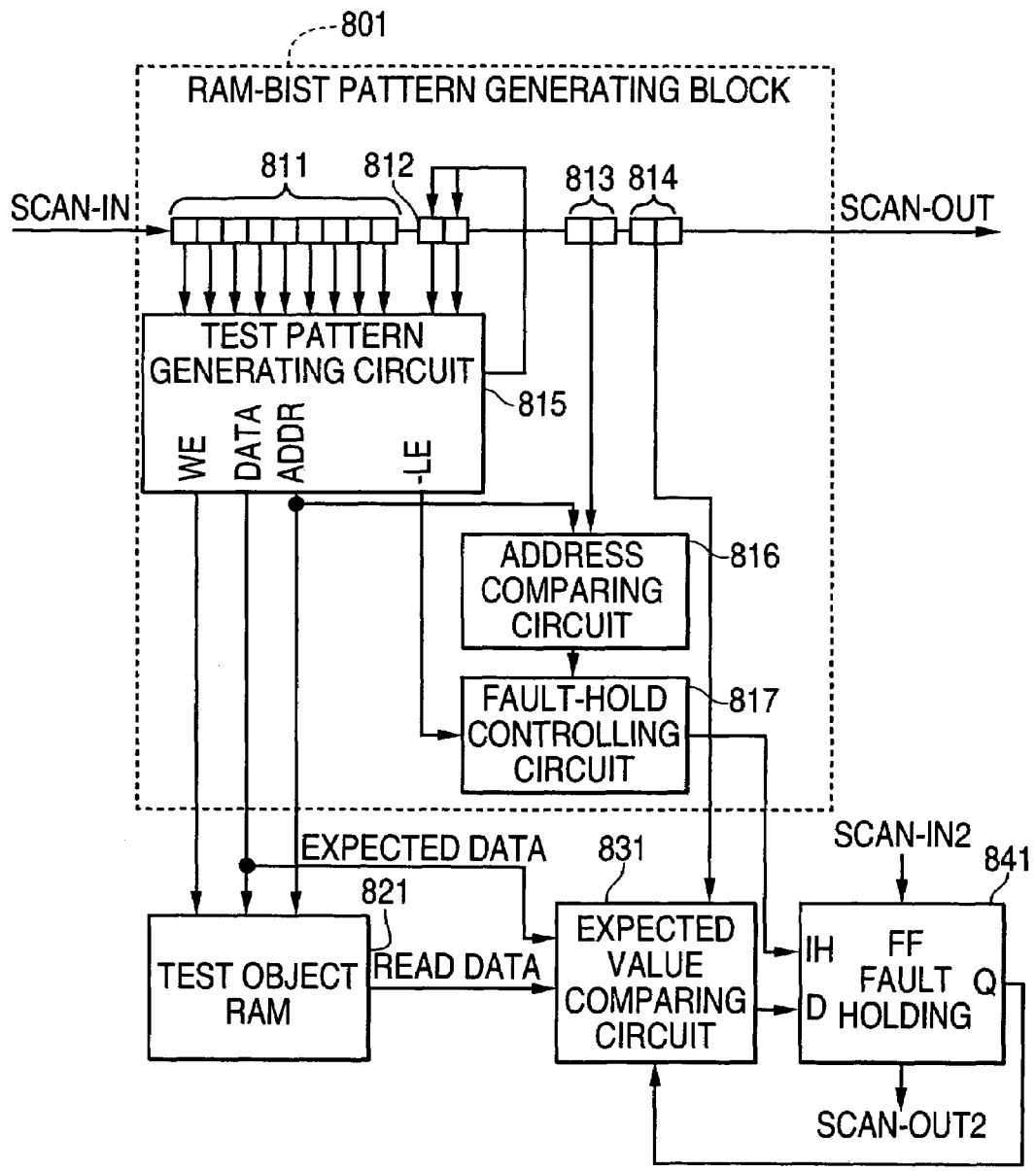
FIG. 8 shows a schematic of a RAM-BIST circuit according to a second embodiment of the invention.

FIG. 8 illustrates an example of structure of the RAM-BIST circuit for conducting fault discrimination through limitation of the noted expected value as the second embodiment of the present invention. The RAM-BIST circuit in this embodiment is formed, as the peripheral circuit of the test object RAM 821, of the RAM-BIST pattern generating block 801 comprising therein the test pattern generating circuit 815, address comparing circuit 816 and fault-hold controlling circuit 817 and the expected value comparing circuit 831 and the fault holding FF 841 forming the fault detecting circuit.

In the test pattern generating circuit 815 comprised in the RAM-BIST pattern generating block 801, the scan FF group 811 connected to the scan chain input from scan-in and output to scan-out sets the instruction code and mode signal to be given to the test pattern generating circuit 8 and the scan FF group 812 for counter setting sets the initial value of counter within the test pattern generating circuit 815.

Moreover, in this embodiment, the address comparing circuit 816 compares the noted address, which is set through scan-shift with the scan FF group 813 for setting of noted address for holding the noted address within the scan chain with the read address generated by the test pattern generating circuit 815.

Moreover, in this embodiment, a scan FF group 814 for setting the expected value discriminating signal and for holding the expected value signal within the scan chain is additionally provided in view of controlling the comparing method of the read data generated with the test pattern generating circuit 815, in the expected value comparing circuit 831, using the high expected value discriminating signal or low expected value discriminating signal being set to the scan FF group 814 for setting the expected value discriminating signal through the scan shift.

The expected value comparing circuit compares the expected data with the read data and discriminates detection of a fault when the expected data high value and read data low value in discrimination of the high expected value or when the expected value data low value and read data high value in discrimination of the low expected value.

When error is detected by the relevant comparison, the fault-hold controlling circuit 817 executes the control (inhibit control) for giving enable limitation to the IH (inhibit) terminal of the fault holding FF 841 to prevent the write operation of the relevant comparison result. When the relevant noted address is matched with the read address, the existing negative logic load enable (–LE) signal is output in direct. During the write operation of the relevant test object RAM, fault discrimination should not be conducted because the relevant RAM output is the don't care value or the fixed value. Accordingly, during the write operation of the relevant test object RAM, the negative logic load enable (–LE) signal which is controlled to prevent fault discrimination is generated by the test pattern generating circuit 815.

Figure 9:
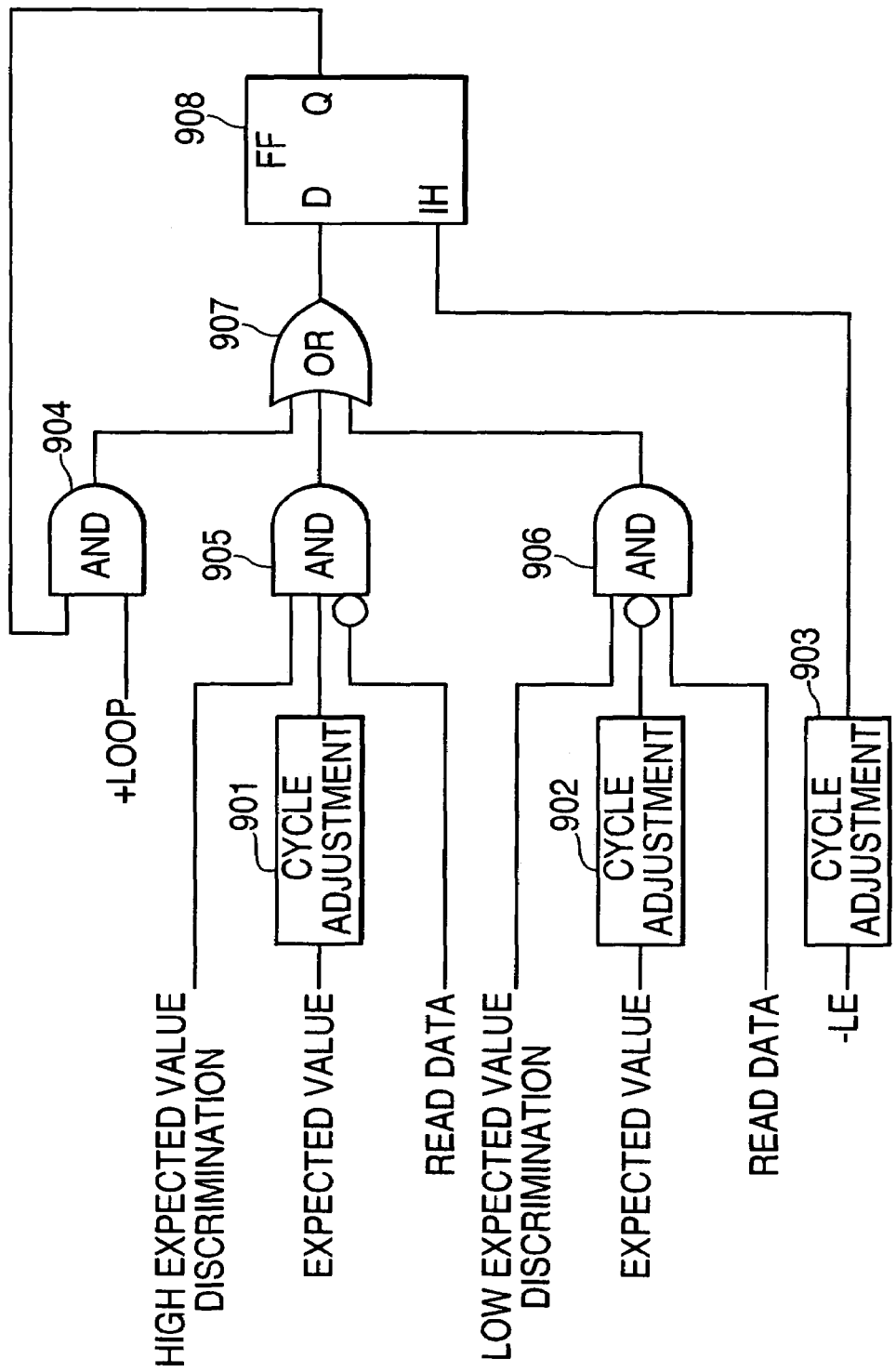
FIG. 9 shows a schematic of a RAM-BIST circuit for use with the second embodiment of the present invention.

FIG. 9 illustrates an example of structure of the fault discriminating circuit for one bit according to the second embodiment of the present invention. The expected value comparing circuit is formed of the AND gates 905, 906 respectively for high expected value discrimination and low expected value discrimination, and discriminates whether the read data from the test object RAM establishes the following fault condition or not at the discrimination of expected value and at the expected value. When the expected value data high value and read data low in the discrimination of high expected value or when the expected value data low and read data high value in the discrimination of low expected value, the fault detecting condition is established and therefore '1' is output as a result of fault discrimination. The relevant test result is written into the FF 908 passing the OR gate 907. Moreover, when the feedback loop circuit is used (loop='1') for the test and a fault is detected in the identical bit, the state having detected the relevant fault with the relevant feedback loop formed of the AND gate 904 is held in the FF 908. Accordingly, after a plurality of times of fault discrimination, the FF 908 may be used as a flag for discriminating generation of a fault in the relevant bit. During the write operation to the test object RAM, since the read data from the relevant test object RAM does not have any meaning, the expected value should not be compared. Therefore, the negative logic load enable (–LE) signal is controlled to (–LE='1') with the RAM-BIST pattern generating block and update of the value held in the FF 908 with the IH (inhibit) terminal of the FF 908 is inhibited. In general, since one or more cycles are required for read of the read data from the RAM, the expected value and the negative logic load enable (–LE) signal adjusts the cycles by the cycle adjusting circuits 901, 902, 903 formed of the shift register for adjustment of cycles of the read data.

Third Embodiment

With the test flow for acquiring the FBM information in the RAM-BIST circuit of the background art illustrated in FIG. 5, the FBM information during the high speed operation of the test object RAM can be acquired but a new problem is generated here. Namely, the total testing time becomes longer because tests are repeated.

In the third embodiment of the present invention, the problem explained above can be solved by conducting the test at a time for the range of the predetermined address or the expected value in place of conducting the test with the single noted address or the single expected value which has been done in the background art and thereafter conducting the screening test for the range of the relevant address or expected value.

For example, when the address is considered here, it is possible to conduct the test with the noted address of the predetermined range in place of conducting the test for the single noted address. As an example, the tests have been conducted repeatedly for 4096 times in order to test the RAM of 4096 words. However, such number of times of test can be reduced to 128 times by conducting the test for the range of noted address in unit of 32 words.

Thereafter, if a fault is generated, the test is conducted with the single noted address only for the address range where a fault is generated. For example, if a fault is detected in the ten (10) address ranges among the number of times of tests of 128, the tests with the single noted address of 320 times are required for further 10 address ranges. Accordingly, the total number of times of test becomes 448 and this number of times of test has been remarkably reduced from 4096 in the RAM testing method in which the total address range is tested only with single noted address.

Figure 10:
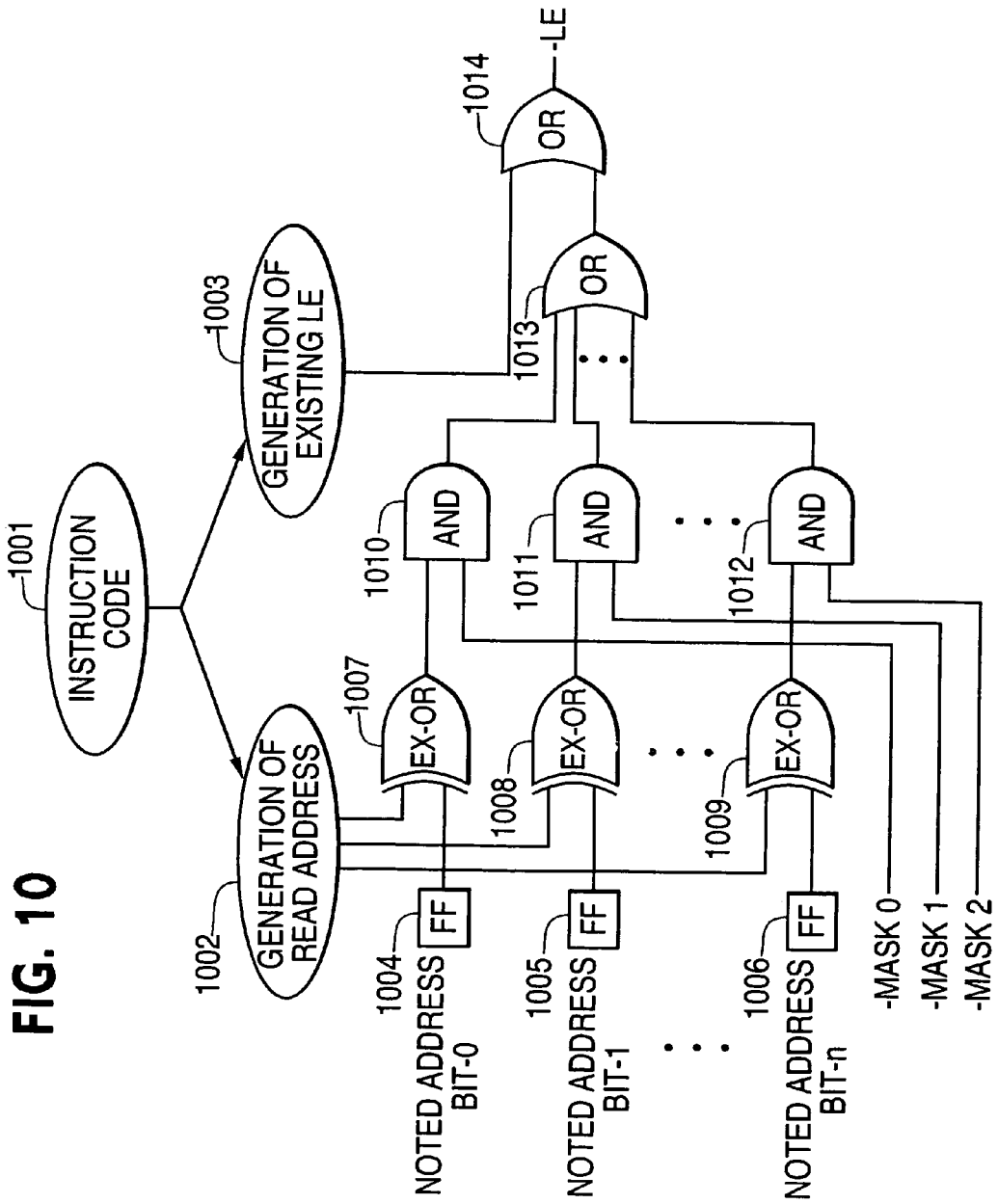
FIG. 10 shows a schematic of an address comparing circuit and a fault holding/controlling circuit according to a third embodiment of the present invention.
Figure 11:
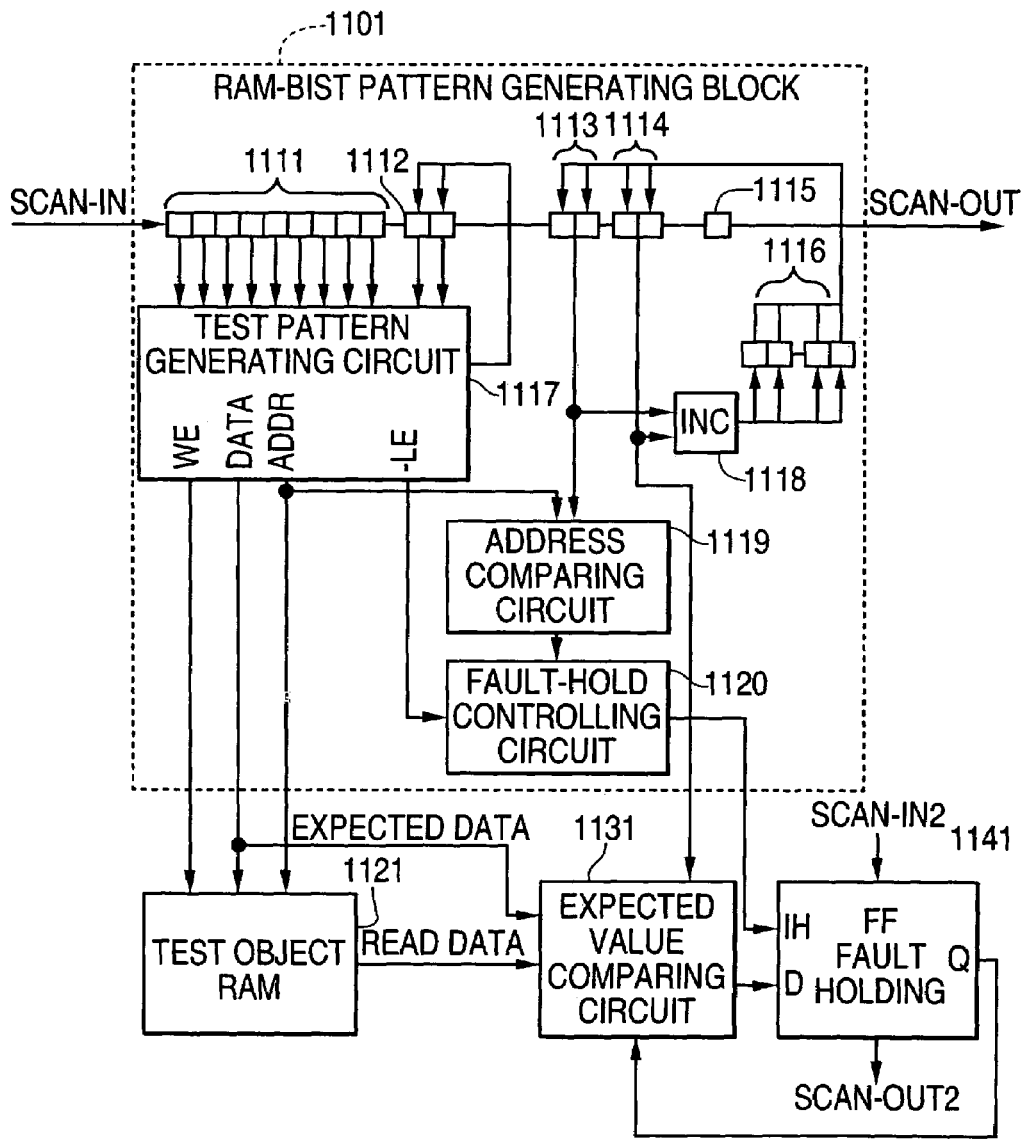
FIG. 11 shows a schematic of a RAM-BIST circuit according to a fourth embodiment of the present invention.

FIG. 10 illustrates an example of structure of the address comparing circuit and fault-hold controlling circuit in the case where the noted address is not selected as the single address but as the predetermined address range as the third embodiment of the present invention. The structure of the RAM-BIST circuit in this third embodiment may be formed similar to the RAM-BIST circuit in the first embodiment for conducting fault discrimination only to the single noted address of FIG. 6.

Difference between the address comparing circuit in the third embodiment and the address comparing circuit in the first embodiment is existence or no-existence of the mast circuit by the AND gates 1010, 1011, . . . , 1012 and that the relevant bits may be treated forcibly as these are matched with the –MASK0 to 3 signals in a part of the bits forming the address of the noted address with the relevant mask circuit. For example, when only the –MASK0 signal is set to '0' and the –MASK1 signal and –MASK2 signal are set to '1', the address bit-0 is treated as being matched and the comparison result is used in direct for the address bit-1 and address bit-2. Accordingly, in any case where the address bit-0 is '0' or '1', fault discrimination is conducted equivalently to the case where the noted address is set in a couple of address range.

Fourth Embodiment

In the first to third embodiments of the present invention, the noted address to be applied to the pattern generating circuit must be set adequately because the tests are repeated while the noted address is changed. However, in the case where the test pattern is prepared for each noted address, the kinds of pattern increases up to countless number. Therefore, it is not practical.

Meanwhile, in the first to third embodiments of the present invention, the identical test is repeated from the beginning as the operations of the test object RAM. In this case, the initial value is given to the pattern generating circuit using the scan shift in each test. Thereby, a problem is also generated. Namely content being held in the scan FF group for setting the noted address existing in the scan chain is broken.

In the third embodiment of the present invention, the noted address for the preceding test is stored in the FF provided in the outside of the scan chain in order to solve the problem explained above. First, since the noted address is not stored for the initial test, the test is started with a value being set with the scan shift and the noted address used for this initial test is stored. Next, the second and subsequent tests are conducted by resetting the noted address stored in the outside of the scan chain and the relevant noted address is stored during the tests. In this embodiment, since it is required to use the information for resetting or not the noted address, the test of all addresses can be done for the relevant test object RAM only with two kinds of test pattern.

An example of structure of the RAM-BIST circuit including the noted address storage mechanism is illustrated in addition to the structure of the second embodiment. The noted address is identical to the counter value which is incremented by each test of RAM, but since the noted expected value in the RAM test can also be treated identically as the noted address by considering it as the address information continuously following the less significant bits of the noted address associated with the noted address under the assumption that the noted expected value is the information associated with the noted address, the noted address and the noted expected value are not particularly discriminated here.

The RAM-BIST circuit of this embodiment is formed, as the peripheral circuits of the test object RAM 1121, of the RAM-BIST pattern generating block 1101 comprising therein the test pattern generating circuit 1117, address comparing circuit 1119 and fault holding/controlling circuit 1120 and the expected value comparing circuit 1131 and the fault holding FF 1141 forming the fault detecting circuit.

In the test pattern generating circuit 1117 comprised in the RAM-BIST pattern generating block 1101, not only the scan FF group 1111 connected to the scan chain input from the scan-in and output to the scan-out sets the instruction code and mode signal to be given to the test pattern generating circuit 1117, but also the scan FF group 1112 for counter setting sets the initial value of the counter in the test pattern generating circuit 1117, and the scan FF group 1113 for setting noted address and the scan FF group 1114 for setting expected value discriminating signal can also set the noted address and expected value discriminating signal.

Moreover, in the present embodiment, the scan FF 1115 for setting the noted address storage resetting flag for determining storage of the noted address to the scan chain or reset of the noted address stored once is provided additionally. Moreover, in this embodiment, a non-scan FF group 1116 for storing the noted address is provided in the outside of the scan chain. This non-scan FF group 1116 for storing the noted address is provided at the outside of the scan chain in order to eliminate influence of scan shift at the time of setting of each RAM test.

Figure 12:
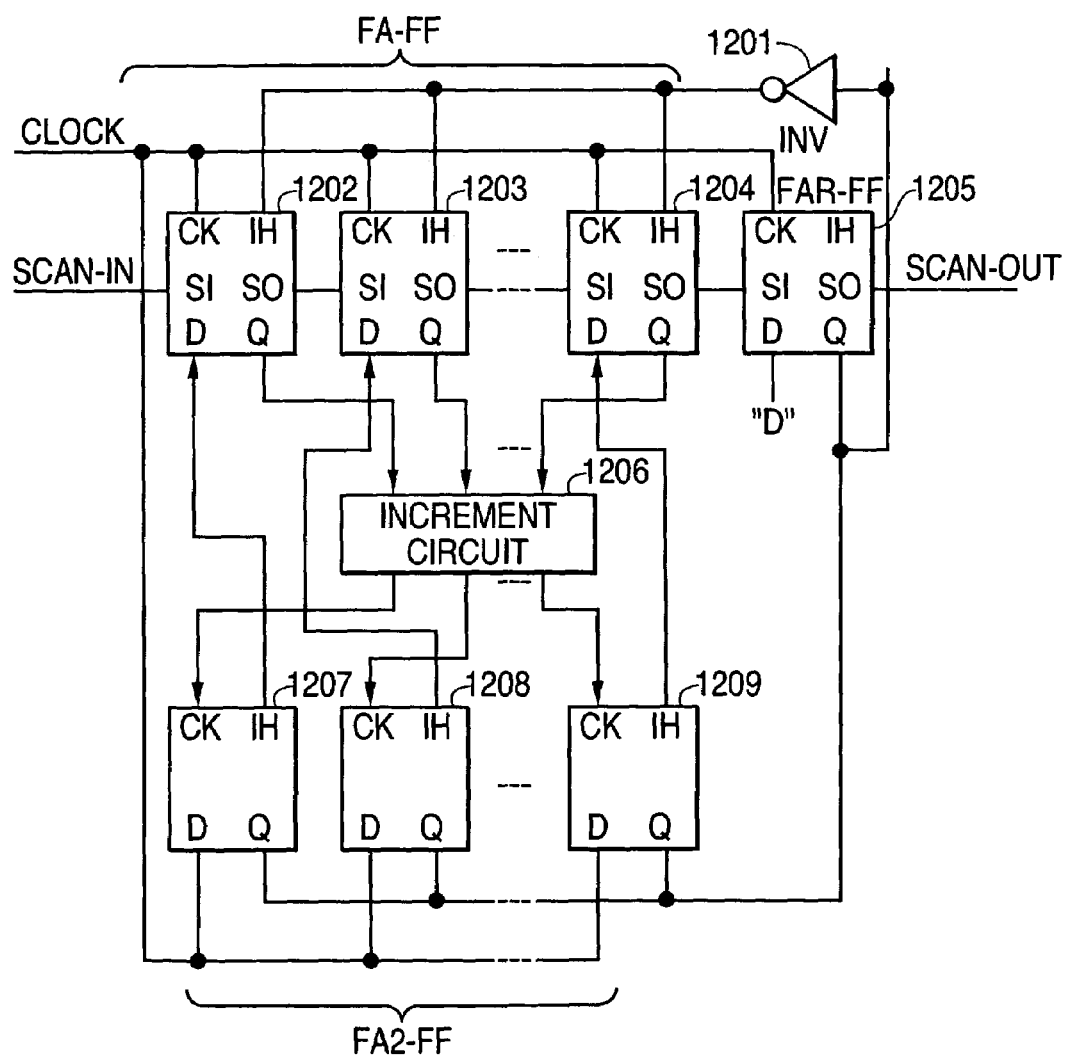
FIG. 12 shows a schematic of a circuit of the noted address storage mechanism for use with the fourth embodiment of the present invention.

FIG. 12 illustrates an example of structure of the circuit of the noted address storage mechanism as the fourth embodiment of the present invention. Since the noted address is required to be changed for each RAM test, the relevant noted address is incremented by one (1) when the noted address is stored. Otherwise, a similar effect can be achieved with the method in which the noted address is incremented when it is reset.

The noted address storage mechanism is constituted with the scan FF (FA-FF) 1202, 1202, . . . , 1204 for setting the noted address connected to the scan chain, the non-scan FF (FA2-FF) 1207, 1208, . . . , 1209 for storing the noted address not connected to the scan chain, the scan FF (FAR-FF) 1205 for setting the noted address storage resetting flag, the increment circuit 1206, and the INV (inverter) gate 1201.

For the RAM test, the address of the first test is set to the scan FF (FA-FF) 1202, 1202, . . . , 1204 for setting the noted address with the scan shift in the first test, while the scan FF (FAR-FF) 1205 for setting the noted address storage resetting flag is set to '0'. Thereby, in the scan FF (FA-FF) 1202, 1202, . . . , 1204 for setting the noted address, the setting value '0' of the scan FF (FAR-FF) 1205 for setting the noted address storage resetting flag is inverted with the INV (inverter) gate 1201. Accordingly, the IH (inhibit) terminal turns ON and thereby update is not conducted even when the clock is applied. In regard to the non-scan FF (FA2-FF) 1207, 1208, . . . , 1209 for storing the noted address, a value of the content of the scan FF (FA-FF) 1202, 1202, . . . , 1204 for setting the noted address which is incremented by one (1) with the increment circuit 1206 is held when the clock is applied.

In the second and subsequent tests, the setting value of the scan FF (FAR-FF) 1205 for setting the noted address storage resetting flag is previously set to '1'. Accordingly, since the setting value '1' of the scan FF for setting the noted address storage resetting flag is inverted with the INV(inverter) gate 1201 in the scan FF for setting the noted address (FA-FF) 1202, 1202, . . . , 1204, the noted address stored in the non-scan FF for storing the noted address (FA-FF) 1207, 1208, . . . , 1209 is reset to the scan FF for setting the noted address (FA-FF) 1202, 1202, . . . , 1204 when the first clock is applied.

Accordingly, the noted address value scan-shifted first is over-written at this timing. The data '0' is written from the D-input in he scan FF for setting the noted address storage resetting flag (FAR0RR) 1205 when the clock is applied. The usual test is started with the second and subsequent applications of the clock and the new noted address is stored in the non-scan FF for storing the noted address (FA2-FF) 1207, 1208, . . . , 1209. Here, in the address resetting cycle where the scan FF for setting the noted address storage resetting flag (FAR-FF) 1205 is set to '1', the RAM-BIST circuit must be stopped not to operate.

Figure 13:
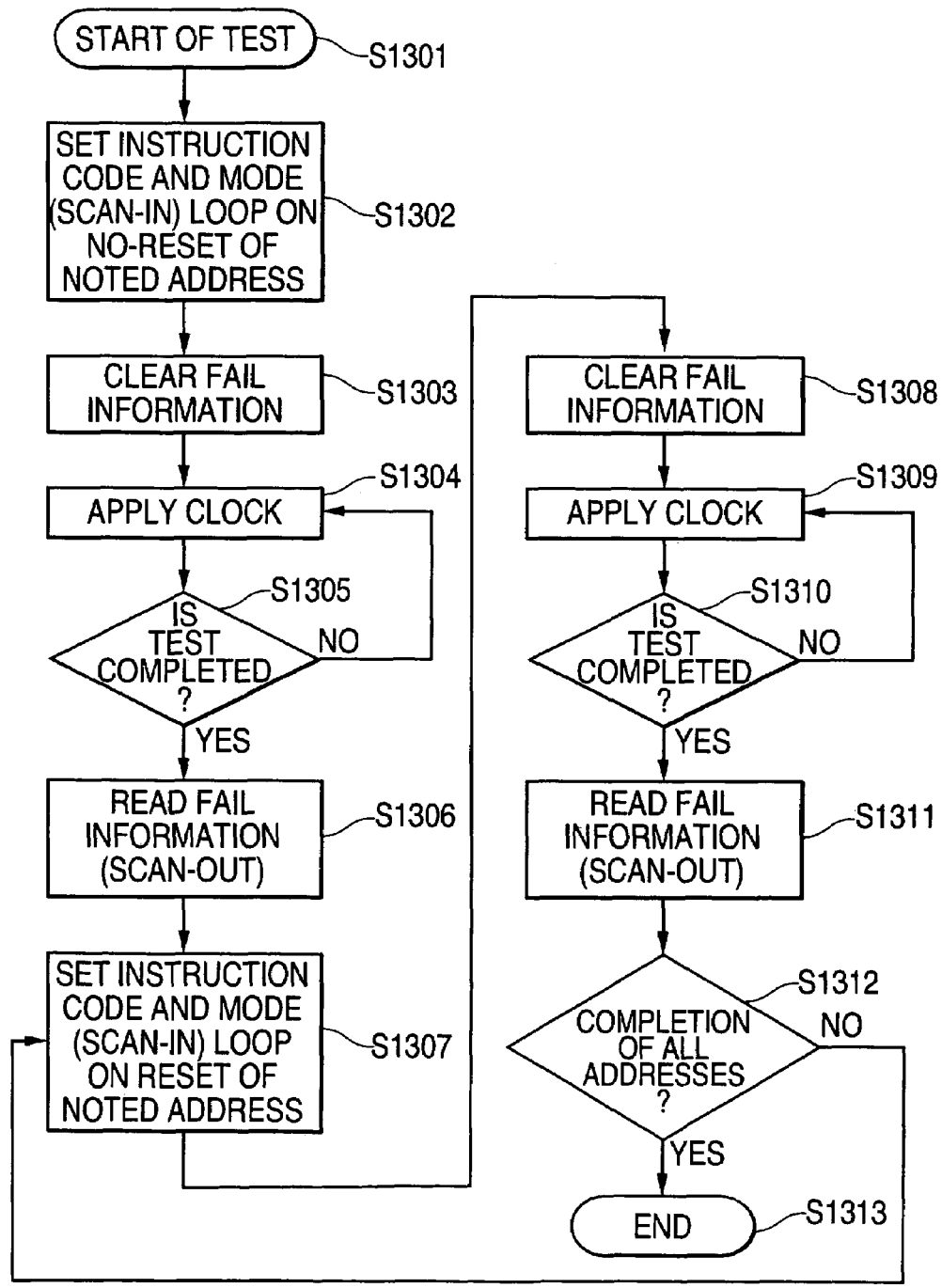
FIG. 13 shows a flow chart according to the fourth embodiment of the present invention.
Figure 14:
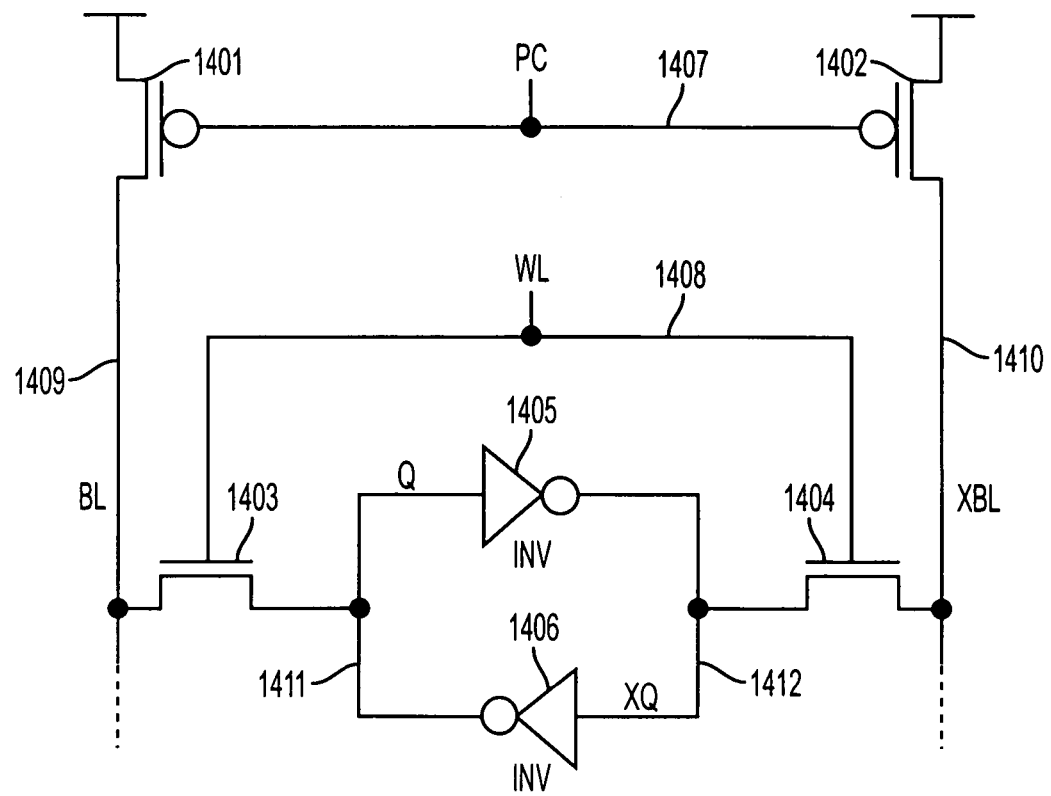
FIG. 14 shows a schematic of an ordinary RAM cell circuit for one bit.
Figure 15:
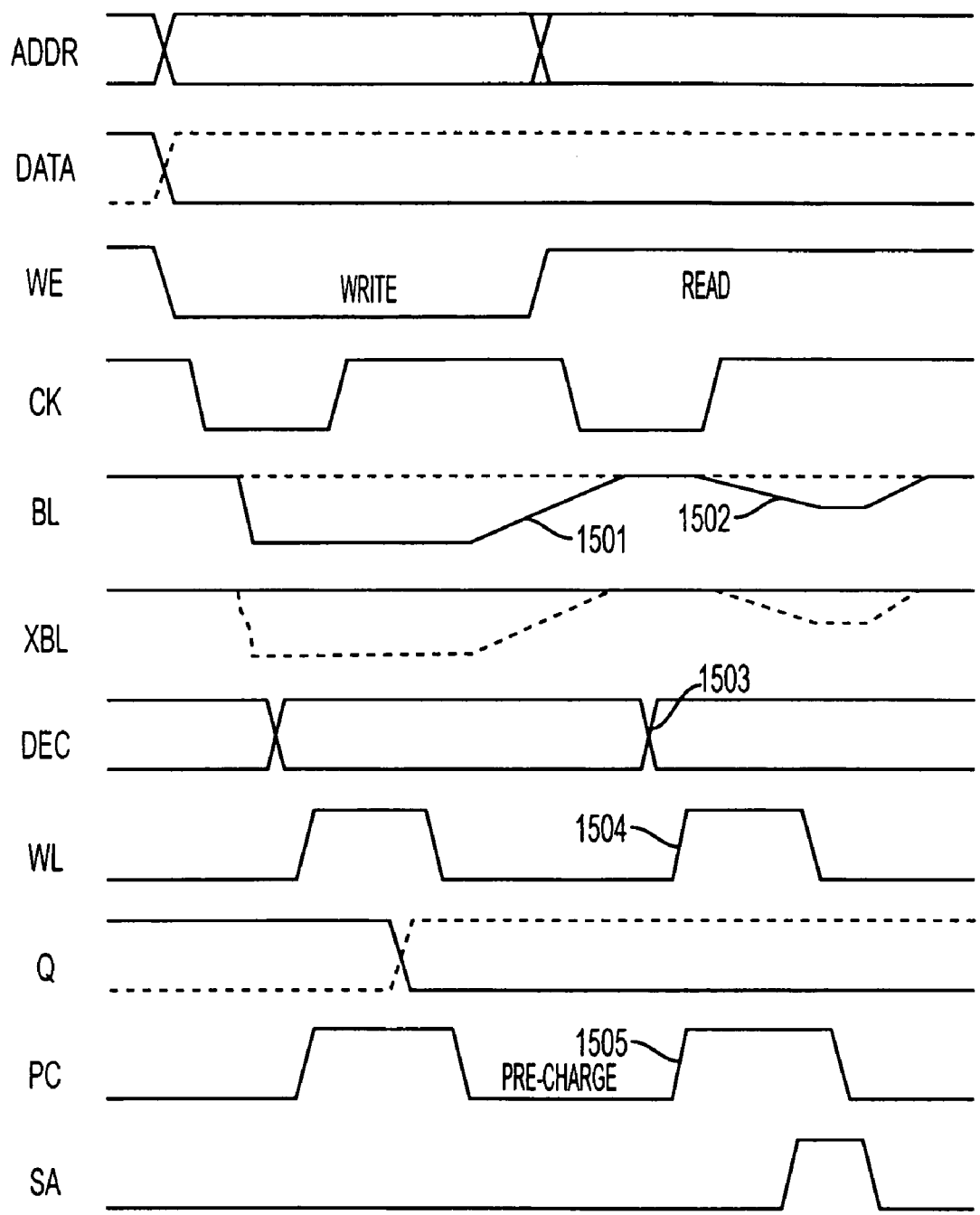
FIG. 15 shows a timing chart illustrating an example of a fault generated in the high speed operation test of RAM.
Figure 16:
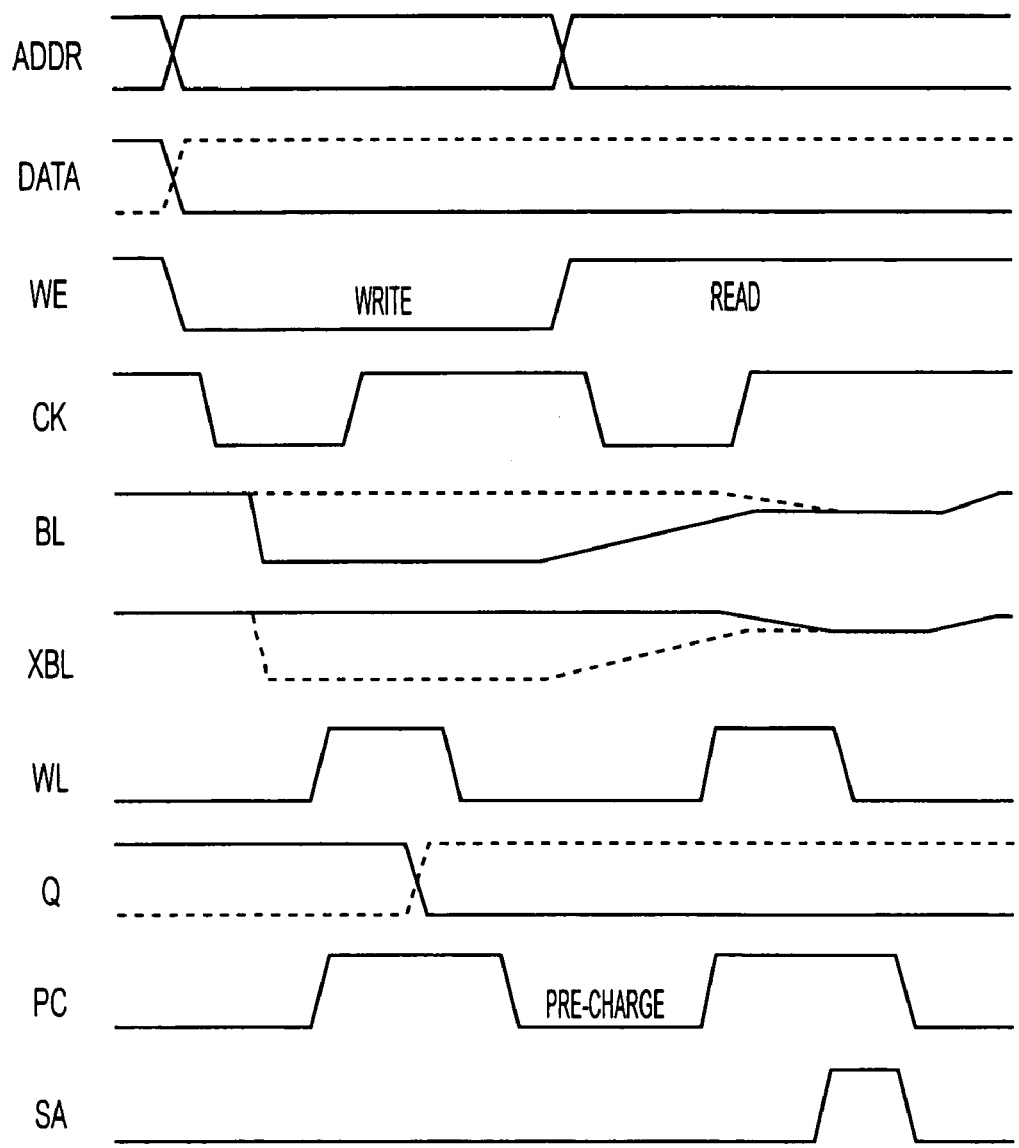
FIG. 16 shows a timing chart when the read operation of the next cycle is started before sufficient precharge of the bit line during the write operation in the high speed operation test of RAM.

FIG. 13 illustrates an example of test flow in the case where the FMB information is acquired in the RAM-BIST circuit where the fourth embodiment of the present invention is adopted. In this embodiment, the single noted address is used for simplifying the explanation.

After start of the test (step S1301), the instruction code and, mode signal can be set with the scan-in to the scan chain of the RAM-BIST pattern generating block and the initial value of counter in the RAM-BIST pattern generating block is also set (step S1302). In this case, the initialization is conducted by setting the feedback loop circuit in the fault discriminating circuit to ON (loop='1'), also setting the scan FF for setting the noted address storage resetting flag to '0', and clearing the fault information stored in the fault holding FF in the fault discriminating circuit (step S1303).

As the next step, the clock enough for testing of the relevant RAM is applied to the test object RAM (steps S1304 to S1305). For each application of the clock, the write and read operations to and from the test object RAM are conducted with the test pattern generated automatically in the RAM-BIST pattern generating block and fault discrimination for the relevant test object RAM is executed with the fault discriminating circuit. After completion of application of the clock required for the test object RAM, the fault information of each bit is stored in the fault holding FF in the fault discriminating circuit. The relevant fault information can be read to the external circuit of the test object LSI by using the scan chain (step S1306).

Next, the instruction code and mode signal are set with scan-in to the scan chain of the RAM-BIST pattern generating block and the initial value of the like of the counter in the RAM-BIST pattern generating block is also set (step S1307). In this case, the initialization is carried out by setting the feedback loop circuit in the fault discriminating circuit to ON (loop='1'), also setting the scan FF for setting the noted address storage resetting flag to '1', and clearing the fault information being stored in the fault holding FF in the fault discriminating circuit.

As the next step, the clock enough for testing the relevant RAM is applied to the test object RAM (steps S1309 to S1310). Whenever the clock is applied, the write and read operations to and from the test object RAM are executed on the basis of the test pattern automatically generated with the RAM-BIST pattern generating block and fault discrimination of the relevant test object RAM is conducted with the fault discriminating circuit. After completion of application of the clock required for the test object RAM, the fault information of each bit is stored in the fault holding FF within the fault discriminating circuit. The relevant fault information is read to the external side of the test object LSI using the scan chain (step S1306).

As the next step, the steps explained above (steps S1307 to S1312) are repeated for all addresses of the test object RAM by resetting the stored noted address. Thereafter, the test using the RAM-BIST circuit is completed (steps S1313).

The test flow to which the fourth embodiment is adapted is different from the test flow, even when the FBM information is acquired, in which the FBM information in the RAM-BIST circuit of the background art is acquired, and is characterized in that it is no longer required to conduct the read operation with the scan shift of the fault information for each read cycle. Therefore, continuous application of the clock is possible and the test can also be conducted under the condition similar to the actual condition of the test object RAM. In this test flow, the test is repeated while the noted address is varied one by one because fault discrimination is carried out only when the particular noted address is read in order to identify the fault generating address. First, the initial test is conducted by setting the noted address with the scan shift. For the second and subsequent tests, the tests are repeated for all addresses of the test object RAM by resetting the noted address stored once. Namely, the fourth embodiment of the present invention can be characterized in that fault discriminations of all addresses are conducted in the second stages.

As explained above, according to the present invention, since fault discrimination is not conducted for the addresses other than the noted address when the RAM test has been conducted using a series of test patterns, if a fault is detected, generation of a fault in the predetermined noted address can be discriminated easily.

Moreover, according to the present invention, since the noted address is set using the increment circuit, it is no longer required to prepare for the test pattern for each noted address and thereby increase in the test patterns can be controlled.

Moreover, according to the present invention, since the noted address is not defined as the single address but as the predetermined address range, if a fault is generated after the test of the relevant entire address range, the total number of times of the test can be controlled by conducting the screening test which is conducted for the single address in the address range where a fault is generated.

Moreover, according to the present invention, since fault detection is not conducted for the expected value other than the noted expected value when all RAM tests are conducted using a series of test patterns, generation of fault can be discriminated easily with the noted expected value when a fault is detected.

Moreover, according to the present invention, the FBM information during the high speed operation of the test object RAM can be acquired with the practical number of test patterns-and the practical number of times of test, resulting in the particular effect that fault analysis can be simplified. As a result, the present invention can provide the effect that the development processes of LSI can be curtailed.

Moreover, the embodiments and operations thereof of the present invention have been described in detail with reference to the accompanying drawings. However, the practical embodiments of the present invention are not limited thereto and the present invention also includes the various changes or modifications within the scope not departing from the subject matter thereof.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A semiconductor device having a scan chain and a storage device, comprising:
    a fault holder holding an error status; and
    a data comparator comparing data read from said storage device to an expected value to detect an error status of said read data; and
    an address holder storing a noted address in said storage device for testing said semiconductor device, the semiconductor device being set with said scan chain, the noted address being a test address; and
    an address comparator comparing said noted address stored in said address holder to a read address for reading said read data; and
    a fault-hold controller conducting enable control of said fault holder when an address match occurs between said noted address and said read address, and storing said error status to said fault holder.

2. The semiconductor device of claim 1, further comprising a scan chain for storing said noted address to an address holder.

3. The semiconductor device of claim 1, further comprising a test pattern generator for generating a test pattern and inputting said test pattern together with said write address to said storage device.

4. The semiconductor device of claim 1, wherein said address comparator conducts enable control of said fault holder when said read address is included within a range of said stored noted address by comparing each bit forming said read address to a mask.

5. The semiconductor device according to claim 1, wherein said data comparator conducts enable control of said fault holder when the expected value data is a high value and said read data is low value.

6. The semiconductor device according to claim 1, wherein said data comparator conducts enable control of said fault holder when the expected value data is a low value and said read data is high value.

7. The semiconductor test device of claim 1, further comprising an address incrementer.

8. The semiconductor device according to claim 1, wherein said address holder is not connected with said scan chain.

9. The semiconductor device according to claim 1, wherein said fault holder includes a feedback circuit.

10. A method for testing a semiconductor device having a scan chain and a storage device, comprising the steps of:
    comparing data read from said storage device to an expected value to detect an error status of said read data; and
    comparing a stored noted address to a read address for reading said read data, the noted address being a test address; and
    conducting enable control of a fault holder holding said error status when an address match occurs between said noted address and said read address, and storing said error status to said fault holder.

11. The method for testing a semiconductor device of claim 10, further comprising:
    reading out a test pattern generated by a test pattern generator via said scan chain.

12. The method for testing a semiconductor device of claim 10, further comprising:
    clocking the semiconductor.

13. The method for testing a semiconductor device of claim 10, further comprising:
    disabling a feedback circuit in said fault holder.

14. The method for testing a semiconductor device of claim 10, further comprising:
    enabling a feedback circuit in said fault holder.

15. The method for testing a semiconductor device of claim 10, further comprising:
    storing said noted address;
    setting a flag to said fault holder with a feedback circuit;
    incrementing said noted address;

storing said incremented noted address; and resetting a value held in said fault holder.

16. A system for fault testing in a semiconductor having a scan chain and a memory, comprising:

means for holding an error status; and means for comparing data read from said memory to an expected value to detect an error status of said read data; and means for holding a noted address in said memory for testing said semiconductor, the semiconductor device being set with said scan chain, the noted address being a test address; and means for comparing the noted address stored in said means for holding a noted address to a read address for reading said read data; and means for conducting enable control of said means for holding an error status when an address match occurs between said noted address and said read address, and storing said error status to said means for holding an error status.

* * * * *